Aug. 21, 1956 R. W. PETER 2,760,012

SEMICONDUCTOR VELOCITY MODULATION AMPLIFIER

Filed April 26, 1955 2 Sheets-Sheet 1

INVENTOR.
Rolf W. Peter
BY J. L. Whittaker
ATTORNEY

Aug. 21, 1956 R. W. PETER 2,760,012

SEMICONDUCTOR VELOCITY MODULATION AMPLIFIER

Filed April 26, 1955 2 Sheets-Sheet 2

INVENTOR.
Rolf W. Peter
BY J. L. Whittaker
ATTORNEY

United States Patent Office 2,760,012
Patented Aug. 21, 1956

2,760,012

SEMICONDUCTOR VELOCITY MODULATION AMPLIFIER

Rolf W. Peter, Cranbury, N. J., assignor to Radio Corporation of America, a corporation of Delaware Application April 26, 1955, Serial No. 504,046
9 Claims. (Cl. 179—171)

This invention relates to amplifiers, and particularly to a novel method and means for amplifying high frequency electromagnetic waves. The present application is a continuation-in-part of my copending divisional application Serial No. 410,073, filed February 15, 1954, now abandoned.

A class of amplifier tubes is known which depend upon velocity modulation of an electron beam for their operation. The klystron and the travelling wave tube are examples of such amplifiers. The velocity modulation tubes require for operation the production of a beam of electrons in an evacuated space. Therefore, the use of vacuum techniques is essential for the construction of velocity modulation amplifiers. The velocity modulation type of amplifier is usually considered especially suited for the amplification of microwaves, for reasons well known.

It is an object of the invention to provide a novel type of amplifier.

Another object of the invention is to provide amplifiers in the construction of which vacuum techniques are unnecessary and which does not require an evacuated space for operation of a velocity modulation type of amplification.

A further object of the invention is to provide a method and means of amplification of microwaves which does not require a vacuum or an electron beam gun, but which, on the contrary, operates without the necessity of vacuum pumping or an evacuated envelope.

A still further object of the invention is to provide a novel means and method of amplification of microwaves.

An intrinsic semiconductor is defined as a substantially pure semiconducting body in which very few donor or acceptor atoms are present. Intrinsic materials are characterized by a number of factors, one of which is high resistivity.

An N-type semiconductor is defined as one in which the crystal lattice has an excess of negatively charged current carriers, i. e., electrons, and a P-type semiconductor is one defined as having an excess of electron deficiency centers, i. e., "holes."

According to the invention, a semiconducting body has applied to it a direct-current voltage to inject therein current carrying elements (electrons or holes). These current carrying elements flow through the semiconductor along a path within the semiconductor. The current carrying elements may be either majority or minority carriers, preferably the latter. There is applied to the semiconductor at the same time an electromagnetic wave to be amplified. This wave is guided along the path. The phase velocity of this wave is controlled to be in the vicinity of the average velocity of flow of the current carrying elements, to produce interaction between the applied wave and the electrons or holes, as the case may be. This interaction then provides amplification because the electrons or holes bunch in their passage through the semiconductor medium. As the electrons or holes bunch, they give up their kinetic energy received from the applied direct-current field, thereby amplifying the applied electromagnetic wave. The injected current carrying elements are restricted to passage within the semiconductor medium. The electrodes for injecting the elements and for applying the direct-current voltage are, therefore, preferably arranged and shaped to take best possible advantage of the interaction, and to conform the flow of these elements to what may be considered a defined path of these elements within the semiconductor. Further, the semiconductor should be suitably protected from metallic contacts which might reduce the desired direct-current voltage gradient within it, thus reducing the flow of the elements.

Although it is preferred that the semiconducting body be of intrinsic material, the body may comprise N-type or P-type conductivity material. It also is preferred that the current carrying elements injected into the semiconductor be minority carriers, although satisfactory operation is afforded in accordance with the invention by the injection and utilization of majority carriers.

In many instances it may be desirable to inject electrons rather than holes into the semiconductor. This may be done for two reasons. One reason is that electrons have a faster velocity for a given value of applied direct-current field. Since faster moving current carrying elements (electrons) are used the problem of reducing the phase velocity of the electromagnetic field interacting with the current carrying elements is mitigated. The second reason is that bunching of holes is restricted by the lattice structure of the semiconductor. A greater degree of bunching and closer bunching of electrons is therefore attainable.

The foregoing and other objects, advantages, and novel features of the invention will be more fully apparent from the following description when read in connection with the accompanying drawing, in which like reference numerals refer to like parts, and in which.

Figures 5, 6, 7, 8, 9:
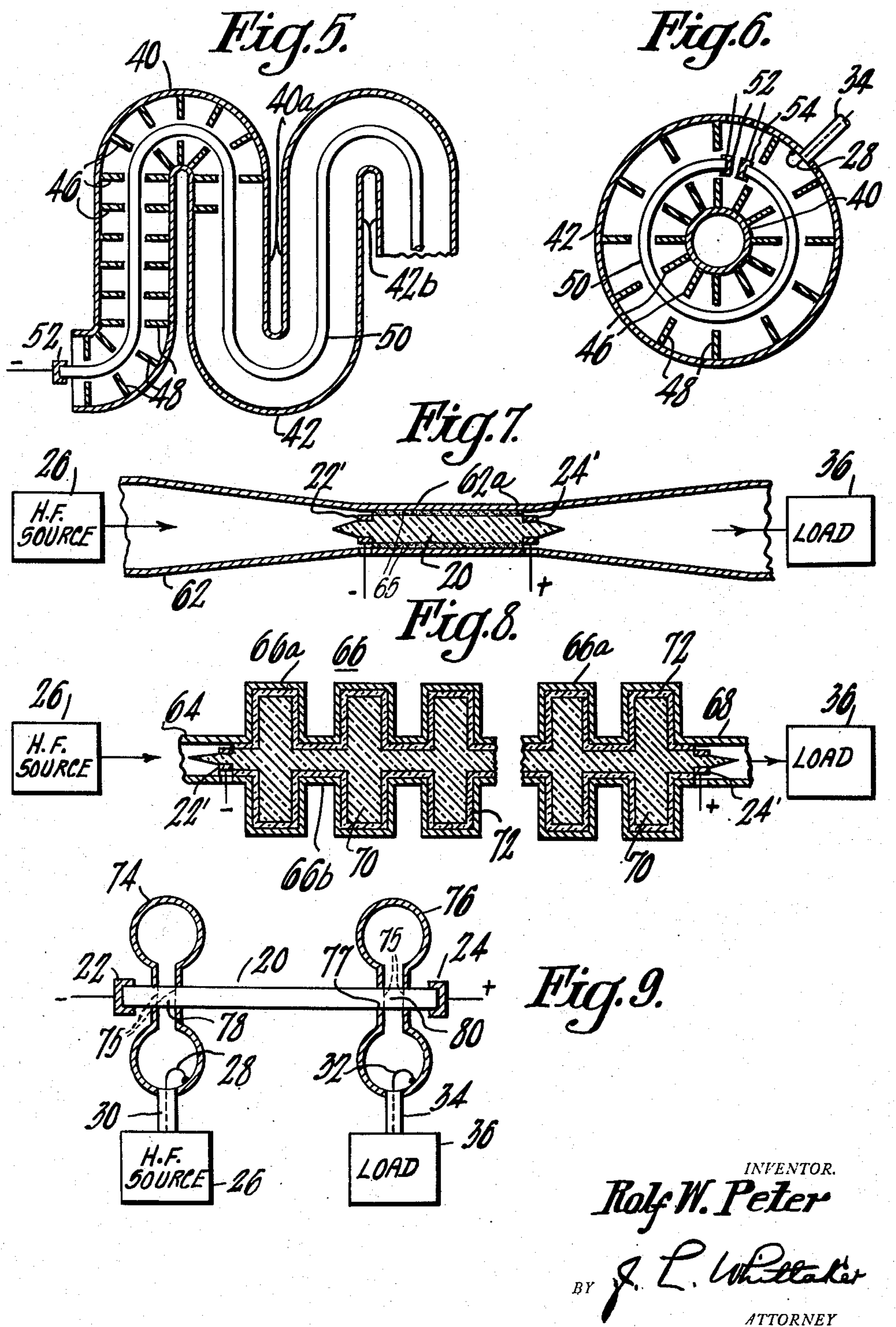
Figure 5 is a longitudinal cross-sectional view of a still different embodiment of the invention which may be considered as a variation of the embodiment of Figure 2, with the rectangular waveguide folded in convolutions to make the amplifier more compact than that of Figure 2.
Figure 6 is a cross-sectional view of still another embodiment of the invention arranged in a continuous loop so that the output end feeds directly into the input end of the waveguide, to form a compact generator.
Figure 7 is a longitudinal cross-sectional view of a further embodiment of the invention in which the semiconductor material itself through which the interacting current carrying elements flow is used as a phase velocity reducing means in a hollowpipe waveguide.

Figure 8 is a longitudinal cross-sectional view of a still further embodiment of the invention in which the phase velocity reduction secured in a hollowpipe waveguide by corrugations or the like is enhanced by filling the interior of the waveguide with the semiconductor material; and Figure 9 is a longitudinal cross-sectional view of another embodiment of the invention employing a pair of cavity resonators each coupled at a different region along the path of current carrying elements.

Figure 1:
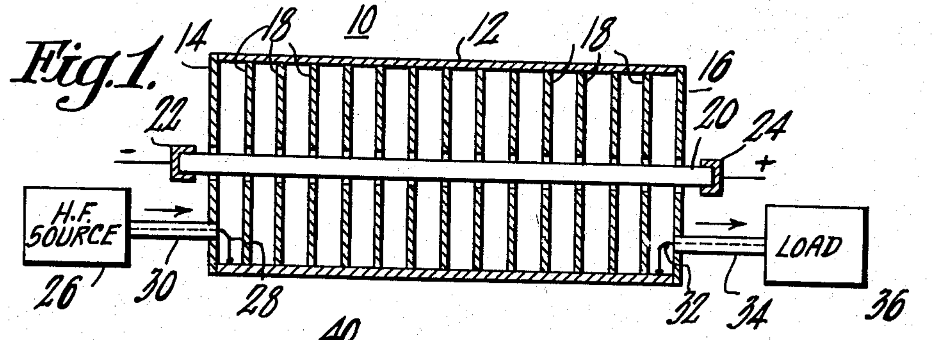
Figure 1 is a longitudinal cross-sectional view of one embodiment of the invention using a circular hollowpipe waveguide with phase velocity reducing radial plates or baffles.

Referring to Figure 1, a hollowpipe waveguide 10 includes a cylindrical wall 12, end walls 14 and 16 and annular plates or baffles 18 supported by the cylindrical wall 12. These walls and plates preferably are metallic and may be, for example, brass, stainless steel, or the like. The ends walls 14, 16 and plates 18 are coaxially positioned at equal intervals, with aligned coaxial apertures. A cylindrical rod 20 of semiconductor material passes completely through the apertures from end to end of the waveguide 10. It is preferred that the rod 20 be formed from intrinsic semiconducting material although P-type or N-type conductivity materials may be used. At one end an electrode 22 and at the other end an electrode 24 are connected to the rod 20. The electrodes 22 and 24 are connected to the rod 20 so that the connections are rectifying. The electrodes are connected to opposite polarity terminals of a source of direct-current potential, as indicated by the minus and plus signs, respectively, adjacent to the electrode leads 22 and 24. A source of electromagnetic waves 26, preferably of high frequency or microwaves, is coupled at one end of waveguide 10 by any suitable coupling means, as by the input loop 28 terminating the coaxial line 30 to which energy from the source 26 is supplied. At the other end by suitable means such as an output loop 32, the amplified output energy from the novel amplifier is coupled to an output coaxial line 34, for application to a load 36.

In the embodiments hereinafter described it is preferred and assumed that a single crystal semiconducting body of intrinsic resistivity material is employed and that the current carrying elements injected therein are electrons. As mentioned previously, however, N-type and P-type conductivity bodies may be used alternatively with the injection of either majority or minority carriers. In situations where N-type or P-type semiconducting bodies are used it is preferable, but not essential that minority carriers be injected into the body.

Preferably, as shown in Figure 1, the wave is impressed near the end of the waveguide from which the current carrying elements, the electrons, progress toward the other end. The alternating electromagnetic wave is impressed to travel through the semiconductor in the same direction as the electrons and with nearly the same velocity. The electric field of the wave in the semiconductor interacts with the electrons in motion, in a manner analagous to that in which the wave in a velocity modulated tube interacts with the electrons of the beam of electrons. Therefore, in the semiconductor, a "bunching" effect results from the interaction, notwithstanding possible losses due to recombination and scattering.

If the wave velocity cannot be reduced to be near the velocity of the electrons, it may be desirable to employ interaction with a space harmonic wave, which has a lower velocity. An analogous interaction is known in travelling wave tubes. The space harmonic wave may be employed in the other arrangements illustrated herein for interaction with the flow of current carrying elements, where the space wave is applied with a waveguide or coil.

As the electrons are caused to "bunch" and "debunch," they continuously give up energy to the wave. The result is that the wave reaches the output end amplified, and the amplified wave is coupled to the output line 34 by means of the coupling loop 32, and used for any desired purpose, as indicated by the load 36.

In order to maintain the direct-current electric field gradient within the semiconductor, it is desirable that there be no metallic short-circuits between portions of the semiconductor. For this reason, the semiconductor is shown spaced from the metallic waveguide end walls and plates. Such spacing may be best secured by means of a thin coating of good dielectic insulating material, such as varnish, or the like (not shown) over at least the inward aperture edges. Alternatively, the entire waveguide may be filled with a low-loss dielectric with a large dielectric constant such as polyethylene ceramics or titanates (not shown), which has the advantage of further decreasing the radio wave phase velocity. This filling may also be used to support the semiconductor in the waveguide.

Figure 2:
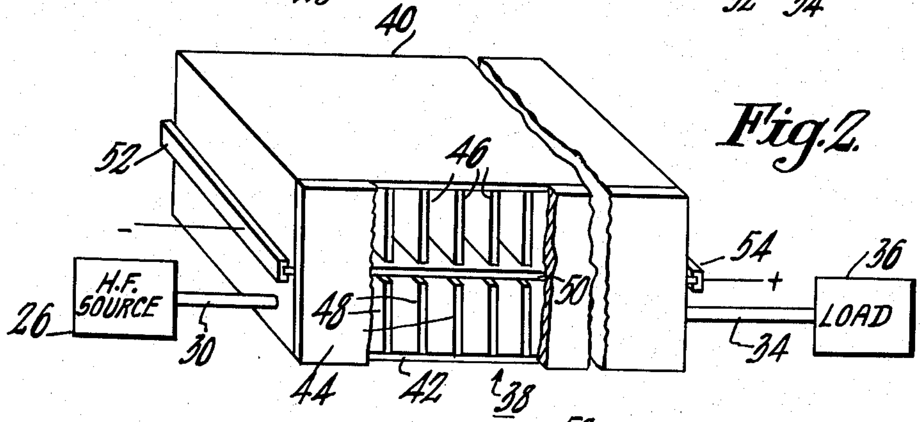
Figure 2 is a perspective view of another embodiment of the invention using a rectangular hollowpipe waveguide with phase reducing rectangular plates or baffles.

Referring to Figure 2, the amplifier 38 includes a hollowpipe waveguide having parallel broad metallic walls 40, 42 and parallel narrow metallic walls, only one of which, 44, is visible in the view of Figure 2. The longitudinal axis of the waveguide is understood to be in the direction of normal wave propagation, parallel to the broad and narrow walls and centrally between them. A series of like parallel flat rectangular metallic plates, equally spaced apart, depend normally from and are in contact with the upper wall 40. A series of like parallel flat rectangular metallic plates, similar in size and shape to the upper plates 46 and also equally spaced apart and coplanar with the upper plates, are erected normally from and in contact with the lower wall 42. The plates 46, 48 preferably extend transversely of the waveguide axis into contact with the narrow walls. A planar plate of semiconductor 50 extends axially in a central plane through the longitudinal axis and parallel to the broad walls 40, 42. Metallic electrodes 52, 54 are connected to make rectifying connections at the ends (in the longitudinal direction) of the slab 50. A source of direct-current voltage is connected between the electrodes through suitable leads, as indicated. The path of electron flow is therefore throughout the semiconductor plate 50. The source 26 may be coupled at one end of the waveguide 38 as by the coaxial line 30. The load 36 may be coupled to the other end of the waveguide 38 as by the coaxial line 34. Here, as before, the thin varnish coating between the plate edges and semiconductor may be in insulating contact with and support the semiconductor, or dielectric side spacers may be employed. These expedients may be used in any of the embodiments to insulate the dielectric from metallic short-circuiting and to provide suitable support.

In operation, the amplifier of Figure 2 acts in a manner similar to that of Figure 1. The semiconductor 50 carries electrons throughout its length and width. These injected and accelerated electrons interact with the electromagnetic wave impressed on or within the semiconductor 50. It may be observed at this point that there must be electric field components of the radio wave in the direction of travel of the current carrying elements to modulate the velocity of these elements. The plates 46, 48 afford this field, by fringing from their edges, as they are coplanar. The desired fringing is absent in a rectangular hollowpipe waveguide excited in the $TE_{01}$ mode and not having the plates, or if the waveguide with plates is not properly excited. The dominant TM mode is preferred to provide the axial electric field component. This situation is similar to that in Figure 1, where a TM mode should also be used. It is of course, necessary to have the electromagnetic wave within the semiconductor 50 in the path of the stream of electrons in it to interact therewith to produce the desired velocity modulation of the electron velocity in the direction of the flow resultant from application of the direct-current field. In this manner, energy in the wave is increased by the energy converted from the element motion imparted by the direct-current field. The appropriate mode of excitation of whatever waveguide is selected to apply the radio wave to the semiconductor is chosen with these requirements in mind. The amplified output appears at the coupling to line 34 and is thence supplied to the load 36.

At this point it may be mentioned that the devices of Figure 1 and Figure 2 may be made to operate as oscillation generators in a manner distinct from employing the usual feed-back means. The current carrying elements, say electrons, may interact with the so-called backward space-harmonic mode. The space wave of this mode travels in a direction the reverse of the direction of electron travel. With the phase velocity appropriately chosen in relation to the electron velocity, the bunching and de-bunching of the electrons re-inforce or amplify this wave which, as it travels toward the end of the device from which the electrons are injected, is applied to the electron path at a region ahead of that from which the wave is re-inforced by the additional energy arising from the bunching and de-bunching.

Figure 3:
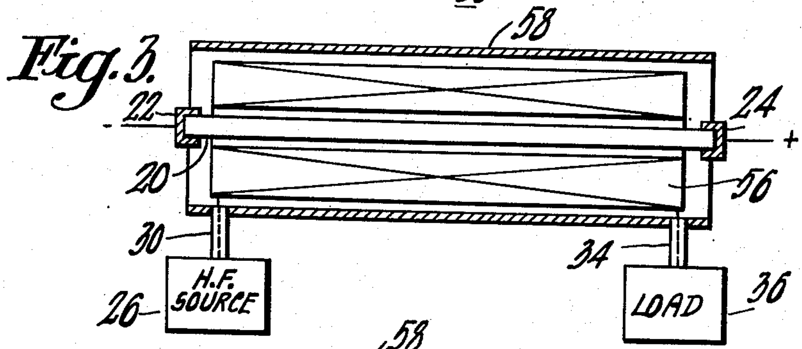
Figure 3 is a schematic view and Figure 4 a partial longitudinal cross-sectional view of still another embodiment of the invention using a coil for phase velocity reduction of the radio wave and with a coaxially located semiconductor.
Figure 4:
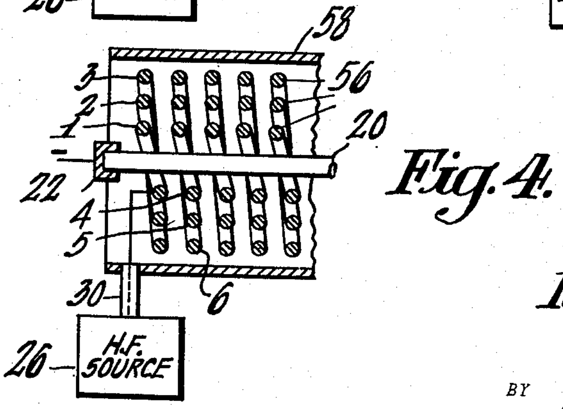

In Figure 3, the waveguide may be a travelling wave coil, such as the single helix used in a travelling wave tube. However, it is preferred to use a multi-layer coil, as illustrated in Figure 4, to reduce the phase velocity of the radio wave within the semiconductor below what it would be if a single layer coil were employed. Referring to Figures 3 and 4, the travelling wave coil is indicated as 56. The cylinder 20 of semiconductor material and the electrodes 22, 24 may be the same as in Figure 1. The coil is wound in a manner indicated in the partial view of Figure 4 in which the turns are numbered consecutively from 1 in the order in which wound. In the inductance art this would be known as a bank wound coil. The windings are shown slightly displaced for easier illustration. Preferably both the layers and successive side-by-side turns are preferably suitably spaced, and farther apart than a wire diameter. Any suitable form (not shown) may be used if desired, if the coil is not self supporting. Connection from the source 26 is made by extending the inner conductor of coaxial line 30 into direct contact at the beginning of the first turn 1. A shield 58 may be employed if desired. The shield itself is shown in longitudinal cross-sectional view in Figure 3, and only a portion of it is shown in Figure 4 in order to expose the remainder of the amplifier.

The operation will be apparent from what has been said heretofore. In brief, the radio wave is guided by the coil from input to output end. The final winding at the output end is connected directly to the inner conductor of output line 34. With the coil 56 acting as a waveguide, which requires only a wave of sufficiently short free-space wavelength in relation to the coil dimensions, the longitudinal electric fields of the radio wave at the axis interact with the stream of electrons in the semiconductor to bunch the electrons and amplify the wave.

The arrangement of the amplifier of Figure 5 may be best understood by considering that the amplifier of Figure 2 is modified by folding the device of Figure 2 (and its longitudinal axis) into convolutions of a sinuous nature, with such stretching as necessary. The ribbon-like semiconductor 50 maintains its constant width and thickness, at least substantially, but is now undulated in the axial directions. The entire waveguide is undulated in the plane of the narrow walls. Therefore, each narrow wall lies in its own single plane, whereas the broad walls are non-planar. It is apparent that the adjacent looped wall portions as at 40*a* and 42*b* may be considered a common single wall, as far as operation is concerned. The longitudinal axis of the waveguide, or the axis of wave propagation may be defined as the continuous line having at each point thereof the direction of energy flow of the wave and each point of the line being located centrally of the wave energy in the directions normal to the direction of wave propagation. This axis of wave propagation is linear in Figures 1–4. But in Figure 5 the axis of wave propagation is undulating. The arrangement of Figure 5 has the advantage of compactness for equivalent length of the waveguide axis as compared with the arrangement of Figure 2.

Referring to Figure 6, the amplifier is arranged with output coupled to input to provide a generator or oscillator. In this arrangement, the waveguide 38 is also deformed in the plane of the narrow walls, but in this case into a single loop to make the waveguide and its longitudinal axis continuous and circular. The output, or a portion thereof, then feeds the input directly. The inner waveguide wall 40 and the plates 46 may be omitted if desired, and sufficient waveguiding action may persist for the device to be operable. Such omission affords considerable simplification of structure. Leads may be brought out through small apertures as shown.

It is clear that the oscillator generates oscillations when suitable D. C. voltage is appleid to the electrodes 52, 54. The oscillations are started by noise or stray impulses, amplified, and the feed-back is direct. If the feed-back is not in correct phase for oscillations at the desired frequency, the spacing between the two plates adjacent each other and the spacing between the plus and minus electrodes may be suitably changed, or the phase velocity between the two varied by variable insertion of a piece of dielectric (not shown). Energy may be withdrawn to the load 36 by suitable coupling from any desired place in the oscillator, but preferably by a coupling near the plus terminal.

Referring to Figure 7, the high frequency source is coupled to a hollowpipe waveguide 62 which may be rectangular or circular. To be specific, it will be assumed circular. The solid cylinder 20 of semiconductor may be the same as in Figure 1, but the electrodes 22′ and 24′ are abbreviated versions of the electrodes 22 and 24, the former being metallic rings in contact with the semiconductor as an electron injector and collector at each end of cylinder 20. The cylinder 20 preferably completely fills the hollowpipe 62 for a portion 62*a* of constricted internal diameter, except that it is insulated from metallic contact by a layer 65, of dielectric varnish or the like to avoid short circuit of the direct-current voltage and diminution of the direct-current voltage gradient in the semiconductor. The rings 22′ and 24′ are likewise insulated from contact with the wall of waveguide 62. Terminals for application of the direct-current voltage to the rings 22′ and 24′ are brought out through suitable apertures in the waveguide wall. The constricted portion 62*a* is connected with the larger diameter waveguide portions on either side by sections tapered suitably to reduce reflections. The cylinder 20 may also have tapered ends added for the same purpose. The load 36 is coupled to the waveguide at the end thereof remote from the coupling of source 26.

In operation, the waveguide is excited by the energy from the source 26 in a mode having axial electric vectors. The electromagnetic wave must have waves with electric vectors parallel to the direction of the particle flow induced by the D. C. voltage at the points of interaction. The transverse magnetic modes have such vectors. Therefore, one of these, such as the $TM_{021}$ mode, is excited by appropriate means. When the energy from the high frequency flows through the cylinder 20, the dielectric effect of the semiconductor itself serves to reduce the phase velocity of the electromagnetic wave energy within the waveguide section 62*a*. The diameter of section 62*a* is selected, taking due account of the effective dielectric constant of the semiconductor material, to provide the desired phase velocity. For this purpose, it should be recognized that the diameter of section 62*a* may be either enlarged over or reduced from the diameter of the adjacent portions of waveguide 62. The operation of the embodiment of Figure 7 will be understood from what has been said hereinbefore. The amplified energy continues, of course, from the end of the semiconductor cylinder 20 remote from source 26 through the waveguide 62 toward the load 36.

Referring to Figure 8, a rectangular hollowpipe waveguide 64 receives energy from the source 26. The section view of Figure 8 is taken in a plane parallel to the narrow walls and including the axis. One end of a waveguide 66, to be more fully described is joined to waveguide 64. Another rectangular waveguide 68 is joined to the other end of waveguide 66 and is coupled to the load 36. The waveguide 66 has alternate sections 66*a* and between them alternate sections 66*b*. This waveguide 66 may be considered as a rectangular waveguide the top and bottom walls (those conforming to the broad walls of the undeformed rectangular waveguide) of which are bent or otherwise deformed with rectangular corrugations, the narrow side walls of the undeformed waveguide being extended where necessary to maintain closure of the sides. The corrugations or deformations are made in the H-plane of the undeformed waveguide. The corrugations are made symmetrically with respect to the E-plane including the axis of the undeformed waveguide. The axial length of the alternate rectangular grooves of the corrugation is equal to the axial length of the alternate rectangular ridges. The ridged portions define sections **66*b* and the grooved portions 66*a*. The spacing of opposed ridges is preferably equal to that between the broad walls of the rectangular waveguides 64 and 68, as shown. Hence, the joining to waveguides 64 and 68** is smoothly made as a continuation of a ridged portion.

The waveguide 66 may be filled with semiconductor material 70 which is insulated from the metallic waveguide by a thin layer 72 of insulating material shown grossly enlarged. The layer 72 may be a coating of varnish or the like. The semiconductor material may be tapered into waveguides 64 and 68 to reduce reffections. Electrodes 22′ and 24′ may be connected to the semiconductor material 70 near its ends at waveguides 64 and 68 respectively. Leads are brought out through suitable apertures for the application of direct-current voltage as indicated in order to establish a voltage gradient along the waveguide longitudinal axis and induce the desired electron flow along a path in that direction.

The corrugations in waveguide 66 tend to reduce the wave velocity of the waves from the source, and the filling of the material 70 enhances the reduction. The corrugations have at the ridge portions, fringing fields when waveguide section 66 is excited, as by the introduction of waves in the desired TM mode from waveguide 64. These fringing fields have electric vectors parallel to the electron flow and in the electron flow path. Thus, interaction may occur to produce velocity modulation and the resultant density modulation of the electron flow. The phase velocity of the electromagnetic waves should be substantially equal to the velocity of the chosen current carrying elements, as before.

In the arrangement of Figure 9, a resonator 74 of the annular type is coupled to input line 30 by coupling loop 28. The resonator is also coupled to the semiconductor 20 at a gap 78 in the resonator walls. The semiconductor 20 extends through the gap. Spaced wires comprising a grid-like structure 75 suitably insulated from the semiconductor body, may complete the continuity of the resonator walls to the electromagnetic fields within the resonator by extension across what might otherwise be a complete aperture in the wall in the direction transverse to the electron path, thus completing the wall continuity. These wires may be omitted if the aperture is small. Such wires may be employed at each place where the semiconductor body passes through a resonator wall. Farther along the path, a second resonator 76 is coupled to the path in the semiconductor 20 at a gap 80 between its walls. The semiconductor 20 passes through the wall apertures 77. The arrangement may be the same as for the resonator 74 in this respect. Output coupling loop 32 and output line 34 couple the second resonator 76 to the load 36.

In operation, electrons injected from electrode 22 flow along the path in semiconductor 20 between electrodes 22 and 24. As these electrons pass through the gap 78, they are velocity modulated by the electromagnetic fields across the gap resulting from excitation of the resonator by energy from source 26. As the electrons travel along the path toward the resonator 76, they bunch as a result of the velocity modulation applied at the gap 78. At the output resonator gap 80, the bunches of electrons excite the output resonator 76 which is resonant at the operating frequency, and give up energy to the output resonator. Thus the direct-current energy is converted to oscillatory energy at the oscillating frequency, and the input signal at this frequency is amplified. The amplified signal is coupled through the output resonator 76 an output line 34 to the load 36. Although the electrons are accelerated along the path, this acceleration does not result in an increase of velocity along the path, because a condition of equilibrium is reached, due to scattering, in which the average electron velocity is substantially constant throughout the path, notwithstanding the applied direct-current field. Therefore, neither a drift tube, such as is often employed in a klystron using an electron beam in space, nor an equivalent structure, need be employed in the arrangement of Figure 9. However, a metallic shield (not shown) may be employed to surround the amplifier including the semiconductor 20 and the electrodes, to prevent access of stray extraneous high frequency fields from affecting the electron stream by coupling to the path.

The invention thus discloses a means and method of amplifying electromagnetic waves. The amplification is accomplished by establishing in a semiconductor a flow of current carrying elements along a path and impressing an electromagnetic wave having electric vector components in the direction of the flow of these elements along the path, the electromagnetic wave having a phase velocity substantially equal to the velocity of the current carrying elements. The invention is preferably employed for the amplification of energy in the microwave region.

What is claimed is:

1. An arrangement comprising a semiconductor, a pair of electrodes making rectifying contact to said semiconductor, means for applying a direct-current voltage to said electrodes to establish a flow of current carrying elements along a path within the semiconductor, hollowpipe waveguide means for coupling to said path an electromagnetic wave having an electric vector component parallel to the direction of flow in said path, said waveguide having a layer of insulation on its walls and said semiconductor completely filling said waveguide between said walls but insulated therefrom by said layer for guiding said wave along said path with the phase velocity of said wave retarded to be substantially less than the corresponding wave velocity in free space, and means for coupling to said path farther along said path in the direction of flow than said first coupling means.

2. The arrangement claimed in claim 1, said hollowpipe waveguide having cylindrical walls.

3. The arrangement claimed in claim 1, said guide means including a rectangular hollowpipe waveguide having a longitudinal axis and broad and narrow walls symmetrical with a plane including said axis, said broad walls being deformed to provide ridges or corrugations transverse to said axis, said axis being included in the semiconductor body.

4. An arrangement comprising an intrinsic semiconductor, a pair of electrodes making rectifying contact to said semiconductor, means for applying a direct-current voltage to said electrodes to establish a flow of electrons along a path within the semiconductor, hollowpipe waveguide means for coupling to said path an electromagnetic wave having an electric vector component parallel to the direction of flow in said path, said waveguide having a layer of insulation on its wall and said semiconductor completely filling said waveguide between said walls but insulated therefrom by said layer for guiding said wave along said path with the phase velocity of said wave retarded to be substantially less than the corresponding wave velocity in free space, and means for coupling to said path farther along said path in the direction of flow than said first coupling means.

5. An arrangement comprising an intrinsic semiconductor, a pair of electrodes making rectifying contacts to said semiconductor, means for applying a direct-current voltage to said electrodes to establish a flow of holes along a path within the semiconductor, hollowpipe waveguide means for coupling to said path an electromagnetic wave having an electric vector component parallel to the direction of flow in said path, said waveguide having a layer of insulation on its walls and said semiconductor completely filling said waveguide between said walls but insulated therefrom by said layer for guiding said wave along said path with the phase velocity of said wave retarded to be substantially less than the corresponding wave velocity in free space, and means for coupling to said path farther along said path in the direction of flow than said first coupling means.

6. An arrangement comprising a body of semiconducting material having P-type conductivity, a pair of electrodes making rectifying contact to said semiconductor, means for applying a direct-current voltage to said electrodes to establish a flow of electrons along a path within the semiconductor, hollowpipe waveguide means for coupling to said path an electromagnetic wave having an electric vector component parallel to the direction of flow in said path, said waveguide having a layer of insulation on its walls and said semiconductor completely filling said waveguide between said walls but insulated therefrom by said layer for guiding said wave along said path with the phase velocity of said wave retarded to be substantially less than the corresponding wave velocity in free space, and means for coupling to said path farther along said path in the direction of flow than said first coupling means.

7. An arrangement comprising a body of semiconducting material having P-type conductivity, a pair of electrodes making rectifying contact to said semiconductor, means for applying a direct-current voltage to said electrodes to establish a flow of holes along a path within the semiconductor, hollowpipe waveguide means for coupling to said path an electromagnetic wave having an electric vector component parallel to the direction of flow in said path, said waveguide having a layer of insulation on its walls and said semiconductor completely filling said waveguide between said walls but insulated therefrom by said layer for guiding said wave along said path with the phase velocity of said wave retarded to be substantially less than the corresponding wave velocity in free space, and means for coupling to said path farther along said path in the direction of flow than said first coupling means.

8. An arrangement comprising a body of semiconducting material having N-type conductivity, a pair of electrodes making rectifying contact to said semiconductor, means for applying a direct-current voltage to said electrodes to establish a flow of holes along a path within the semiconductor, hollowpipe waveguide means for coupling to said path an electromagnetic wave having an electric vector component parallel to the direction of flow in said path, said waveguide having a layer of insulation on its walls and said semiconductor completely filling said waveguide between said walls but insulated therefrom by said layer for guiding said wave along said path with the phase velocity of said wave retarded to be substantially less than the corresponding wave velocity in free space, and means for coupling to said path farther along said path in the direction of flow than said first coupling means.

9. An arrangement comprising a body of semiconducting material having N-type conductivity, a pair of electrodes making rectifying contact to said semiconductor, means for applying a direct-current voltage to said electrodes to establish a flow of electrons along a path within the semiconductor, hollowpipe waveguide means for coupling to said path an electromagnetic wave having an electric vector component parallel to the direction of flow in said path, said waveguide having a layer of insulation on its walls and said semiconductor completely filling said waveguide between said walls but insulated therefrom by said layer for guiding said wave along said path with the phase velocity of said wave retarded to be substantially less than the corresponding wave velocity in free space, and means for coupling to said path farther along said path in the direction of flow than said first coupling means.

No references cited.